(12) United States Patent
Sindalovsky et al.

(10) Patent No.: US 8,803,573 B2
(45) Date of Patent: Aug. 12, 2014

(54) SERIALIZER-DESERIALIZER CLOCK AND DATA RECOVERY GAIN ADJUSTMENT

(71) Applicant: LSI Corporation, Milpitas, CA (US)

(72) Inventors: Vladimir Sindalovsky, Perkasie, PA (US); Joseph Anidjar, Asbury, NJ (US); Lane A. Smith, Easton, PA (US); Brett David Hardy, Chaska, MN (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 13/647,470

(22) Filed: Oct. 9, 2012

(65) Prior Publication Data

US 2014/0097878 A1  Apr. 10, 2014

(51) Int. Cl.
*H03L 7/06* (2006.01)
(52) U.S. Cl.
USPC .......................................... 327/156; 327/147
(58) Field of Classification Search
USPC .................................. 327/147, 156, 149, 158
See application file for complete search history.

(56) References Cited

U.S. PATENT DOCUMENTS

| 8,648,633 B1 * | 2/2014 | Yu et al. ........................ 327/156 |
| 2009/0273405 A1 | 11/2009 | Cowan et al. |
| 2010/0295586 A1 | 11/2010 | Weiner |

* cited by examiner

*Primary Examiner* — Hai L Nguyen (57) ABSTRACT

In described embodiments, a VCO based CDR for a SerDes device includes a phase detector, a VCO responsive to a first control signal and a second control signal and generating an output signal, a frequency calibration module configured to calibrate the frequency of the output signal by performing a coarse calibration and a subsequent fine calibration, a gear shifting control module controlling a gain change of the first and second control signals in time, and a look-up table created by fine calibration values generated from the frequency calibration module, wherein the programmed variable gain of the gear shifting control module is calculated by a calculation circuit employing the fine calibration values stored in the look-up table, the calculation of the calculation circuit adjusts gear shifting down, and adjusts a gear shifting gain, and adjusting an overall CDR gain over a VCO control curve.

20 Claims, 7 Drawing Sheets

SERIALIZER-DESERIALIZER CLOCK AND DATA RECOVERY GAIN ADJUSTMENT

BACKGROUND

Description of the Related Art

In many applications, including digital communications, clock and data recovery (CDR) systems are employed to recover correct timing (frequency and phase) of an input data stream, which timing is then employed to sample the input data stream to recover the user data for decoding. A serializer-deserializer (SerDes) device is commonly used in high speed communications to convert data between serial and parallel interfaces in each transmit/receive direction.

SerDes devices often employ an encoding scheme that supports DC-balance, provides framing, and guarantees signal transitions. Guaranteed transitions allow a receiver to extract the embedded clock signal (clock data recovery, or CDR), while control codes allow framing, typically on the start of a date packet. This encoding scheme also improves error detection with running disparity, providing separation of data bits from control bits, and permits derivation, of byte and word synchronization.

The existing voltage-controlled oscillator (VCO)-based CDR in a SerDes device often exhibits large variations in data lock time and jitter tolerance due to a relatively-high, non-linearity of the VCO. Conventional methods to correct for these variations concentrate on limiting the range of VCO calibration to the most linear areas of a VCO control curve. A designer often encounters difficulties when attempting to limit calibration of the VCO to an acceptable linear region, especially over large process, supply voltage and temperature (PVT) variations.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

One embodiment of the invention allows for adjustment of a voltage-controlled oscillator (VCO) based clock and data recovery (CDR) circuit. A phase difference signal between an input signal and a feedback signal is detected by a phase detector. The phase difference signal is combined with gear shifting control signals produced by a gear shifting control module to provide a first control signal for a VCO; the first control signal is integrated to a second control signal by an integrator for the VCO; and an output of the VCO is divided to a calibrated reference frequency. The output of the VCO is sent back to the phase detector as the feedback signal. A coarse calibration to the calibrated reference frequency of the VCO is performed with a frequency calibration module; and a fine calibration to the calibrated reference frequency of the VCO is performed with the frequency calibration module. A look-up table is created with fine calibration values generated by the frequency calibration module. The gain of the circuit is adjusted by adjusting gear shifting up or down by calculating gear shifting gains of the gear shifting control signals employing the fine calibration values stored in the look-up table.

BRIEF DESCRIPTION OF THE DRAWINGS

Other embodiments of the invention will become more fully apparent from the following detailed description, the appended claims, and the accompanying drawings in which like reference numerals identify similar or identical elements.

DETAILED DESCRIPTION

Hereinafter, embodiments of the invention are described with reference to the drawings. Described embodiments relate to automatically adjusting CDR loop gain in a VCO-based CDR in, for example, a serializer-deserializer device based on results of VCO calibration. The CDR loop gain adjustment reduces lock time and jitter tolerance variability and makes an overall CDR loop gate relatively independent from process, voltage and temperature (PVT) variations. Adjustment of proportional and integral control loop gains of the CDR based on the nonlinearity characteristics of the VCO control curve allow maintaining the CDR loop gain independent from the PVT variations and, thus, keep CDR locking ability and jitter tolerance independent from the PVT variations.

Note that herein, the terms "control", "frequency control", "frequency control signal", and "control signal" might be used interchangeably. It is understood that a control might correspond to, or contain a control signal of, a frequency control, frequency control signal and that the control signal, frequency control, frequency control signal might refer to a control.

Note that herein, the terms "clock", "clock signal", and "frequency clock" might also be used interchangeably. It is understood that a clock might correspond to, or relate to a clock signal, or a clock frequency, and that the clock signal or clock frequency might refer to a clock.

Note that herein, the terms "CDR" and "CDR loop" might also be used interchangeably. It is understood that a CDR might correspond to, or relate to a CDR loop, and that the CDR loop might refer to the CDR.

Figure 1:
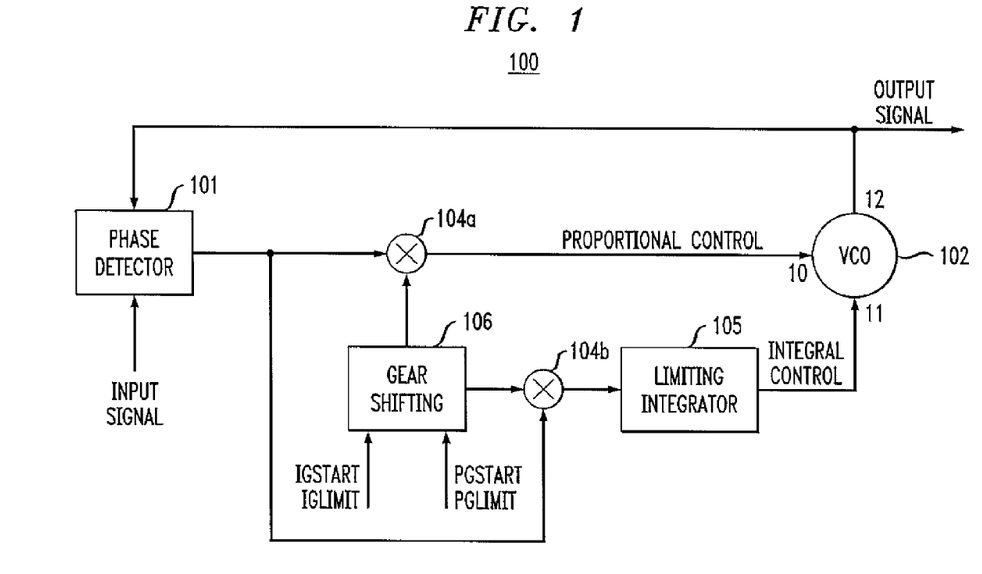
FIG. 1 shows a block diagram of a VCO based CDR according to an embodiment of the invention.

The VCO-based CDR (or PLL) is be employed over a wide variety of architectures, and often employs a digitally controlled VCO instead of a fully analog VCO to reduce power consumption, area, and radio frequency (RF) interference susceptibility. FIG. 1 shows a block diagram of a VCO based CDR employing a simplified digitally controlled VCO according to an embodiment of the invention.

As shown, CDR 100 includes phase detector 101, VCO 102, control multipliers 104a and 104b, limiting integrator 105, and gear shifting control module 106, which form a CDR loop.

Phase detectors might be used, for example, in PLLs or CDR loops in order to lock a signal (which is to be generated, also represent a feedback signal in the loop) at the desired frequency onto the reference signal source.

Phase detector 101 receives an input signal and the feedback signal. Phase detector 101 then compares the phase angles of the input signal and the feedback signal with one another, ascertain a phase deviation which might exist between the input signal and the feedback signal and provide a detected signal at the output of phase detector 101. The detected signal output might be either proportional to or at least dependent on the phase difference or phase offset between the input signal and the feedback signal. The detected signal might be a phase difference signal or a phase offset signal. Herein, phase detector 101 used in CDR 100 is any existing or prospective phase detectors. The detected phase difference signal by phase detector 101 are applied as frequency control signals to frequency controls of VCO 102 of the CDR loop.

VCO 102 is responsive to the frequency control signals from phase detector 101. Herein, the CDR loop includes a proportional control loop formed by phase detector 101, control multiplier 104a and VCO 102, in which a proportional control path might be included between control multiplier 104a, and VCO 102. The CDR loop might also include an integral control loop formed by phase detector 101, control multiplier 104b, limiting integrator 105 and VCO 102, in which, an integral control path might be included between control multiplier 104b and VCO 102 along limiting integrator 105. The frequency control signals might include a proportion control signal having a proportional control loop gain and an integral control signal having an integral control loop gain. A VCO gain might include the proportional control loop gain and the integral control loop gain. The proportional control signal might propagate along the proportional control path, whereas, the integral control signal might pass through the integral control path. VCO 102 might include a first input node 10, a second input node, 11 and an output node 12. The first input node 10 might connect to the proportional control path and receive the proportional control signal from control multiplier 104a. The second input node 11 might connect to the integral control path and receive the integral control signal from control multiplier 104b. An output signal of VCO 102 might output at the recovered clock node 12. The output signal output from VCO 102 might be fed back to phase detector 101 as the feedback signal. The CDR loop might generally be implemented as a second order PLL in order to provide for better lock time to a constant rate or spread spectrum serial input data. Both the proportional and integral control signals might change gains of the proportional and integral controls overtime time, which, in turn, might be controlled by gear shifting control module 106 through control multipliers 104a and 104b.

In one exemplary embodiment of the invention, VCO 102 might be a ring oscillator type VCO. VCO 102 might be typically Implemented as a delay loop with multiple delay stages. Delay of each stage might be controlled through a tail current varied per integral and proportional controls.

In another exemplary embodiment of the invention, VCO 102 might be an inductor-capacitor (LC) type VCO and includes a capacitor bank for controlling the oscillation frequency of the VCO.

In yet another exemplary embodiment of the invention, VCO 102 might be a multivibrator. VCO 102 might be implemented as diode clamps, an inverter and a capacitor. The capacitor might be alternately charged and discharged by constant current and diode clamps might keep output voltage constant independent of frequency.

Limiting integrator 105 might be included in the integral control path. Limiting integrator 105 might convert the proportional control signal from multiplier 104b to an integral as the integral control signal for VCO 102. The integral control signal might then input into VCO 102 through second input node 11. The integral control signal might not exceed specified limits. Limiting integrator 106 might also have two input signals and generate one output signal (see below). The value of the output signal might be proportional to an integral of one of the two input signals with respect to the other as long as the output signal does not exceed specified limits. Herein, limiting integrator 105 employed in CDR 100 might be any existing or prospective limiting integrators.

Gear shifting control module 106 might be coupled to control multipliers 104a and 104b, and control a gain change of the proportional and integral control signals in time. Changing the gains of the proportional and integral loops in time might allow for varying of CDR loop bandwidth. A wider CDR band width at the beginning of locking to the serial input data might reduce lock time of CDR 100. A narrowing CDR bandwidth subsequently might reduce CDR loop jitter and provide for better jitter tolerance of CDR 100.

Gear shifting control module 106 might be synchronized by an external clock signal and configured to generate gear shifting control signals according to a programmed variable gain. The gear shifting control signals generated from gear shifting control module 106 might be combined with the detected phase difference signal in control multiplier 104a to provide the proportional control signal to VCO 102 through a proportional control path. The phase detector output might also pass through multiplier 104b to the integral control path to provide the integral control signal to VCO 102 by converting the proportional control signal to the integral control signal by limiting integrator 105.

A phase update request from phase detector 101 might be converted to a single up, down, or no phase update operation. The resulting phase update might be processed by gear shifting control module 106 and multipliers 104a and 104b. This processing by gear shifting control module 106 and multipliers 104a and 104b might have a higher multiplication coefficient in the initial phase of locking to a serial data stream, providing for wider bandwidth, in order to reduce the time required to phase lock to the incoming serial data rate. After start-up, over the course of time, the gain of gear shifting control module 106 and multipliers 104a and 104b is reduced, narrowing the bandwidth, and, thus, reducing the self-jitter of the bang-bang phase detector based implementation of CDR 100. Herein, for the proportional control, the gain of gear shifting control module 106 might start at PGSTART and end at PGLIMIT, whereas, for the integral control, the gain of gear shifting control module 106 might start at IGSTART and end at IGLIMIT. The integral and proportional loop gains might be set by programmable IGSTART and PGSTART correspondingly to gear shifting control module 106, and after some time gear shift down to IGLIMIT and PGLIMIT. The final phase update request from multiplier 104a might be applied as a proportional control to VCO 102. The proportional control loop gain might directly control a proportional control loop frequency-to-control gain, and the integral control loop gain might define how quickly the CDR loop might acquire data frequency offset from the current VCO frequency. As will be described below, the proportional control might be implemented as "pulse modulated" for VCO 102.

Figure 2:
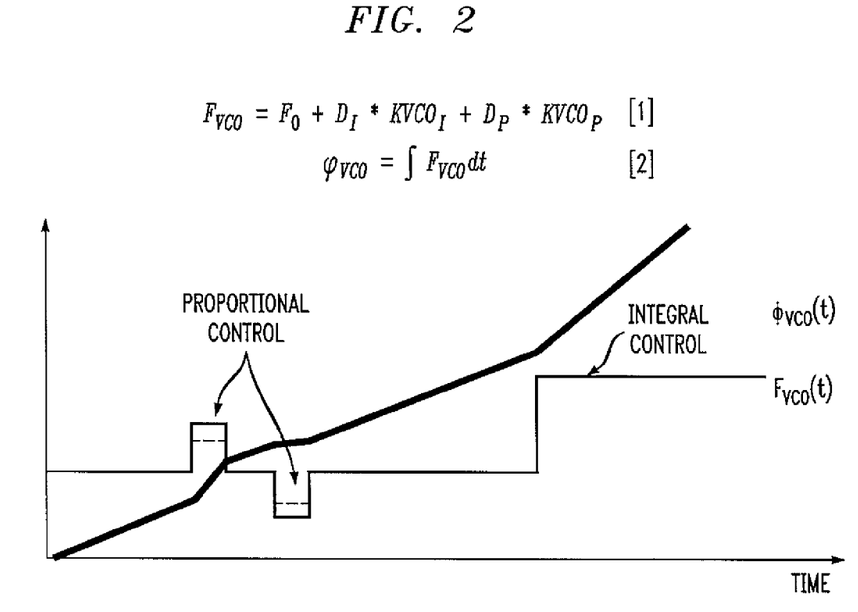
FIG. 2 shows a timing diagram of proportional and integral controls of the VCO shown in FIG. 1 according to an embodiment of the invention.

FIG. 2 shows a timing diagram of proportional and integral controls of the VCO shown in the FIG. 1 embodiment of the invention.

The output frequency of the VCO, $F_{VCO}$, might be described by relation (1), $$F_{VCO} = F_0 + D_I * KVCO_I + D_P * KVCO_P \quad (1)$$

where $F_0$ might be the center frequency of the VCO, $KVCO_I$ might be the VCO integral gain, $D_I$ might be the integral control, $KVCO_P$ might be the VCO proportional gain, $D_P$ might be the VCO proportional control.

Thus, the phase of sampling clock, $\phi_{VCO}$, shown in thick solid line in FIG. 2, might be an integral of $F_{VCO}$ as it might be shown by relation (2).

$$\phi_{VCO} = \int F_{VCO} dt \quad (2)$$

As shown, the proportional control might be applied as a pulse, and might change the VCO frequency for a short period of time resulting in nudging sampling phase down when frequency increases or resulting in nudging sampling phase up when frequency decreases. The VCO proportional gain might vary which might be shown by dashed line changing the phase movement per one pulse application. The integral control might be a level, magnitude control. When the integral control changes, the frequency of the VCO might correspondingly increase or decrease. The proportional and integral gains of the VCO, as well as the center frequency, $F_0$, of the VCO, might be dependent on the PVT conditions.

In order to compensate for the PVT variations of VCO parameters, such as the proportional and integral gains of the VCO, the VCO might be calibrated on power up.

Figure 3:
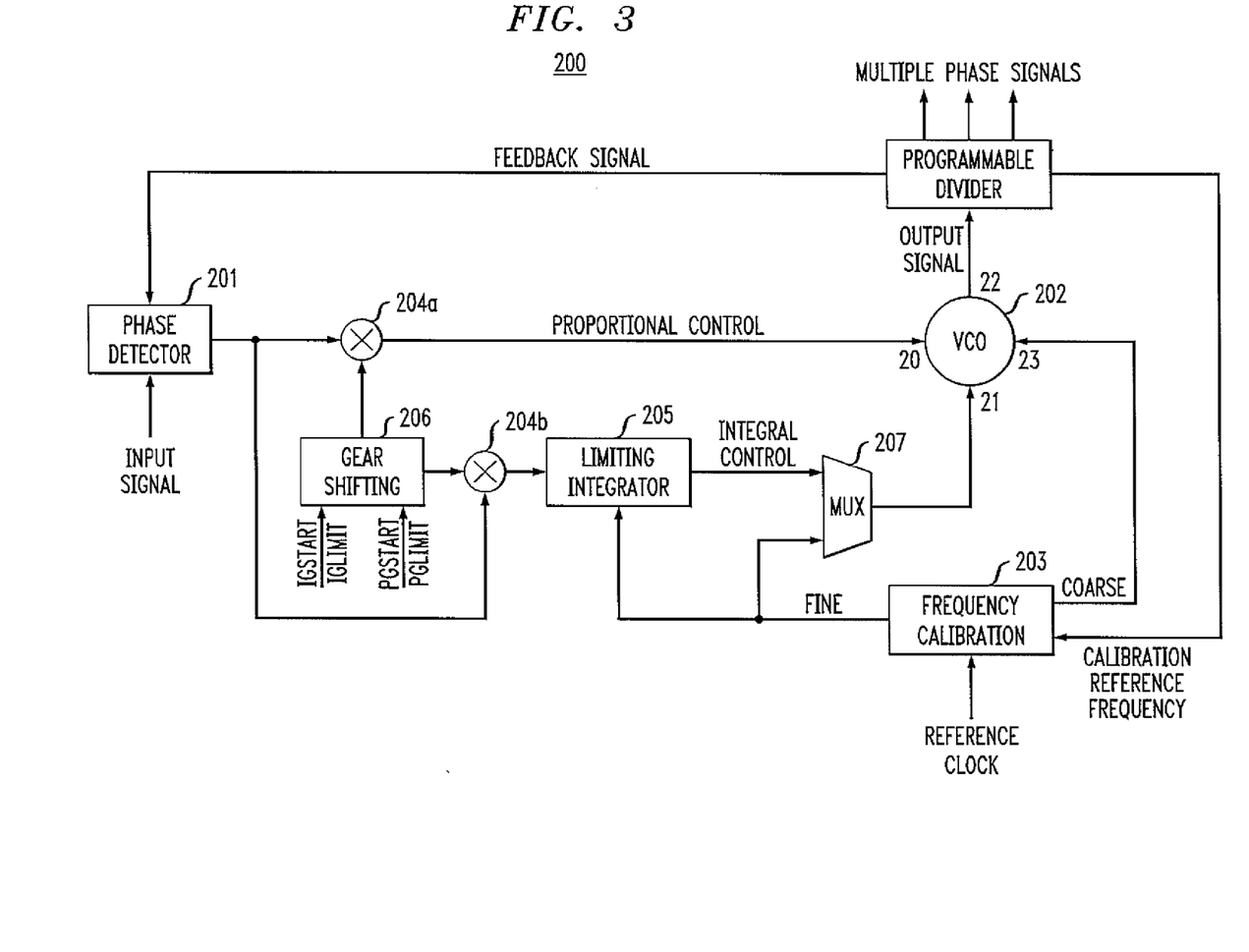
FIG. 3 shows a block diagram of a VCO based CDR with VCO calibration according to an embodiment of the invention.

FIG. 3 shows a block diagram of a VCO based CDR with VCO calibration according to an embodiment of the invention.

As shown, CDR 200 includes phase detector 201, VCO 202, frequency calibration module 203, control multiplier 204, limiting integrator 205, gear shifting module 206, and multiplexer 207, and programmable divider 210. Generally, CDR 200 might be CDR 100 shown in FIG. 1 with a calibration module applied to the VCO for VCO calibration. Phase detector 201, control multiplier 204, limiting integrator 205, and gear shifting control module 206 are identical in constitution and operation to phase detector 101, control multiplier 104, limiting integrator 105, and gear shifting control module 106 illustrated in FIG. 1.

Herein, VCO 202 might be VCO 102 shown in FIG. 1 with an extra input node 23 for receiving a digital control signal produced by frequency calibration module 203 to calibrate VCO 202 in digital domain. Limiting integrator 205 might also have two input signals and generate one output signal. The value of the output signal might be proportional to an integral for the first of the two input signals with the other input setting the starting point of limiting integrator 205 at the end of calibration.

One difference between the embodiments of FIG. 1 and FIG. 3 might be in FIG. 3, the VCO output frequency might be divided to a calibration reference frequency by programmable divider 210. Programmable divider 210 might be configured to divide the frequency of the recovered clock generated from VCO 202 with a given dividing ratio, convert the divided signals into multiple phase signals having multiple phases and output multiple phase signals. One of the divided signals of the output frequency of VCO 202 might be applied to phase detector 201 as the feedback signal. Another divided signal might be applied to frequency calibration module 203 as the calibration reference frequency. The calibration reference frequency might be compared to the reference clock frequency form a reference clock over a period of time. The VCO calibration might be done by first a coarse calibration and then a fine calibration through frequency calibration module 203 and applied to VCO 202 through a coarse control and a fine control (integral control), respectively.

First, frequency calibration module 203 might perform the coarse calibration of VCO 202. This might be performed by changing supply voltage to the delay loop of VCO 102 until the output frequency, $F_{VCO}$, might be within a coarse calibration tolerance to the calibration reference frequency. During the coarse calibration of VCO 202, the fine calibration control might be kept in the middle of a VCO integral control range. When the coarse calibration requirements are satisfied, frequency calibration module 203 might switch to the fine calibration of VCO 202. The fuse calibration control might be applied in lien of the integral control of the CDR loop. The fine calibration, control signal and the integral control signal might be combined in multiplexer 207 and then applied to VCO 202 through second input node 21 of VCO 202. Frequency calibration module 203 might adjust the fine calibration control until the output frequency, $F_{VCO}$, might be brought within a fine tolerance to the calibration reference frequency. Fine calibration values generated by the fine calibration of VCO 202 by frequency calibration module 203 might be loaded into limiting integrator 205 and serve as starting values for CDR 200 when locking to serial input data. When the serial input data is not available, CDR 200 might switch back to the fine calibration in order to prevent VCO drift from the calibration reference frequency.

In one embodiment of the invention, frequency calibration module 203 might be a finite state machine (FSM) that might calculate a difference between i) the reference clock frequency and ii) the calibration reference clock frequency corresponding to the frequency of the output signal of VCO 202. Frequency calibration module 203 used in CDR 200 might include existing and prospective frequency calibration techniques known in the art.

Figure 4:
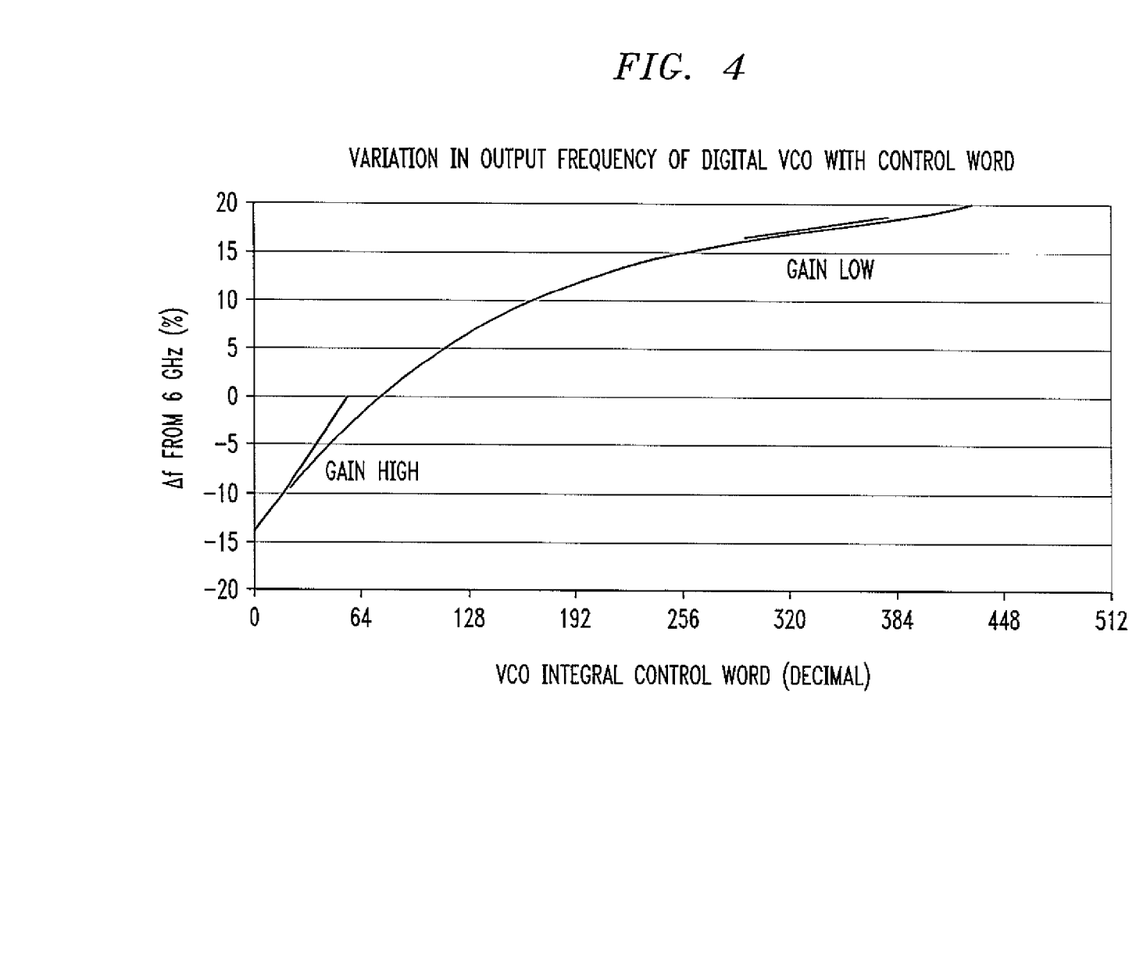
FIG. 4 shows a control curve of the VCO shown in FIG. 3 after calibration according to an embodiment of the invention.

FIG. 4 shows a control curve of VCO 202 shown in FIG. 3 after calibration according to an embodiment of the invention. The control curve of VCO 202 is depicted with a VCO integral control word versus a frequency difference (%), $\Delta f$, from 6 GHz. As shown, the control curve of VCO 202 might be nonlinear. The nonlinearity might make the CDR loop gain, including both the proportional control loop gain and integral control loop gain, depend on the area of the control curve where the VCO calibration settles. The proportional control loop gain and integral control loop gain might be included in the VCO gain. Thus, the CDR loop gain might be dominated or significantly influenced by the VCO gain. If the VCO calibration settles at the lower values of VCO integral control word, then the VCO gain might be higher. If the calibration settles at the higher values of the VOC integral control word, then the VCO gain might be lower. The CDR loop gain might influence data lock time and jitter tolerance of CDR. When the VCO gain falls below a low threshold, this case might degrade CDR ability to lock to data, and its tolerance to low frequency periodic jitter. When the VCO gain reaches above a high threshold, this case might increase CDR loop self-jitter, and thus reduce CDR jitter tolerance.

In order to make CDR loop gain more stable over PVT variations, embodiments of the invention disclose using the results of the VCO calibration to stabilize the CDR loop gain over the PVT variations. Since the VCO control curve is similar for different PVT corners, the final fine calibration values of the fine calibration might be used to adjust integral and proportional gear shifting limits or a full range of the integral and proportional gains. As such, the results of the VCO calibration might stabilize the CDR loop gain over the PVT variations.

Figure 5:
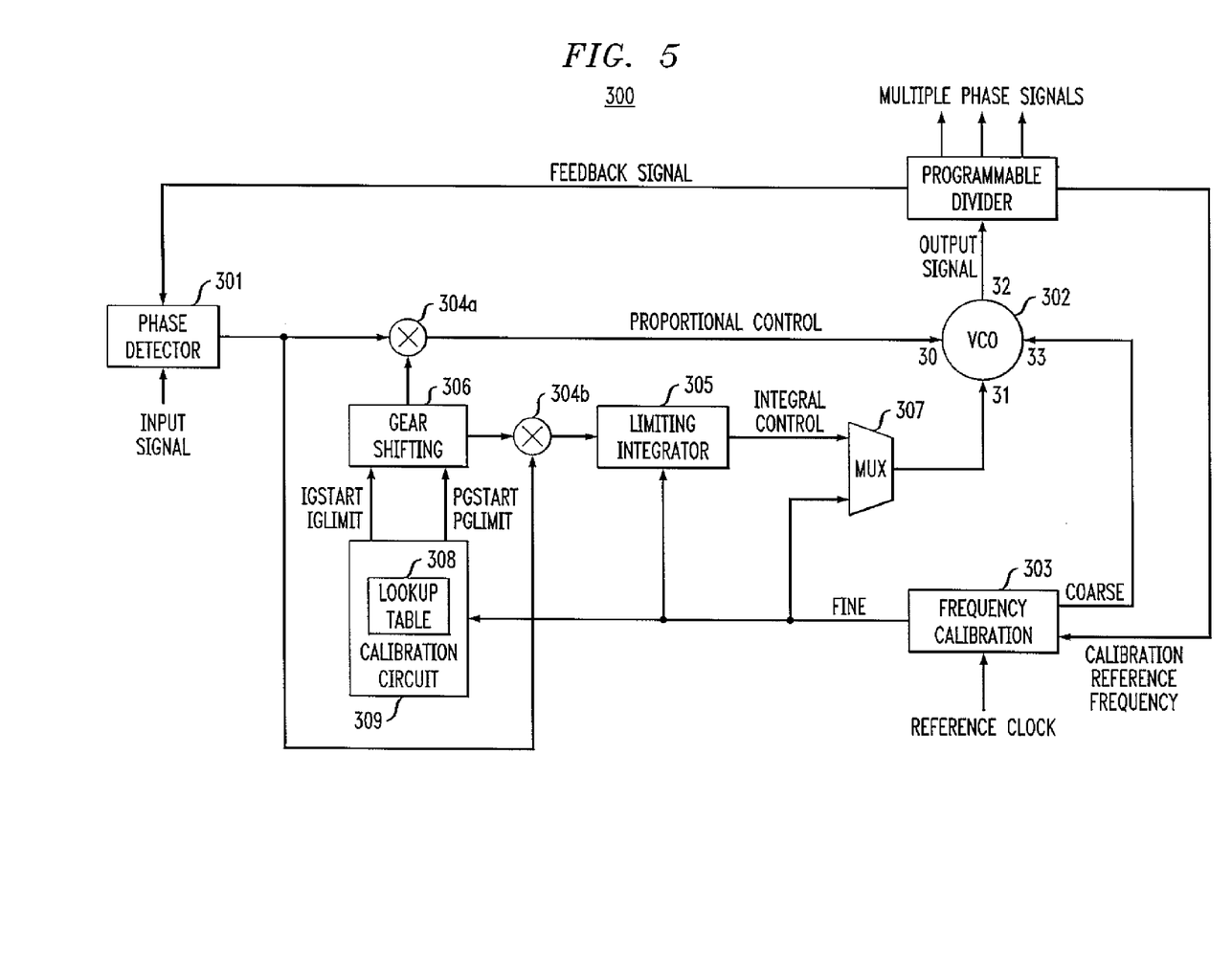
FIG. 5 shows a block diagram of an exemplary embodiment of a VCO based CDR with a gain gear shifting adjustment according to an embodiment of the invention.

FIG. 5 shows a block diagram of an exemplary embodiment of a VCO based CDR with a gain gear shifting adjustment according to an embodiment of the invention.

As shown, CDR 300 includes phase detector 301, VCO 302, frequency calibration module 303, control multiplier 304, limiting integrator 305, gear shifting control module 306, multiplexer 307, look-up table (LUT) 308, calculation circuit 309, and programmable divider 310. Generally, CDR 300 might be similar to CDR 200 shown in FIG. 3 with results of the VCO calibration applied to the gear shifting control module through a look-up table. Phase detector 301, VCO 302, frequency calibration module 303, control multiplier 304, limiting integrator 305, gear shifting control module 306, multiplexer 307, and programmable divider 310 are identical in constitution and operation to phase detector 201, VCO 202, frequency calibration module 203, control multiplier 204, limiting integrator 205, gear shifting control module 206, multiplexer 207, and programmable divider 210 illustrated in FIG. 3.

The difference between the embodiments of FIG. 3 and FIG. 5 might be in FIG. 5, the fine VCO calibration values at the end of the VCO calibration by frequency calibration module 303 might be supplied to gear shifting control module 306 through LUT 308 in calibration circuit 309. LUT 308 might be created by storing the fine calibration values of VCO 302 generated by frequency calibration module 303. LUT 308 might represent a plurality of proportional and integral gains corresponding to different calibrated calibrated fine values of VCO 302. Calculation circuit 309 might use the fine calibration values stored in LUT 308 to calculate ending gains (i.e. IGLIMIT and PGLIMIT) for gear shifting control module 306 based on the region of the VCO control curve where the VCO calibration settles. The calculation of calibration circuit 309 might adjust gear shifting down to the ending gains, IGLIMIT and PGLIMIT, for gear shifting control module 306, thus, adjusting the gains of the gear shifting control signals generated by gear shifting control module 306. Since gear shifting control module 306 might control the proportional control loop gain and the integral control loop gain of CDR 300, the adjustment of the gains of the gear shifting control signals generated by gear shifting control module 306 might adjust the proportional and integral control loop gains. When the gear shifting down is finished, the values of the proportional control loop gain and the integral control loop gain might reach the final values. The final adjustment of the proportional control loop gain and the integral control loop gain, where the gear shifted shifting is down, might allow to compensate for VCO gain variability making an overall CDR loop gain adjustable over a VCO control curve and independent from the PVT variations.

In an alternative embodiment, initial gains (i.e., IGSTART and PGSTART) of gear shifting control module 306 might be adjusted along with the ending gains (i.e., IGLIMIT and PGLIMIT) making CDR loop be able to lock to data at the initial proportional and integral gains of independent from the PVT variations.

In yet another alternative embodiment, an output of limiting integrator 305 might be provided to LUT 308, shown in FIG. 5 as a dashed line, controlling CDR loop gain dynamically when the integral control moves along the VCO control curve shown in FIG. 4.

Figure 6:
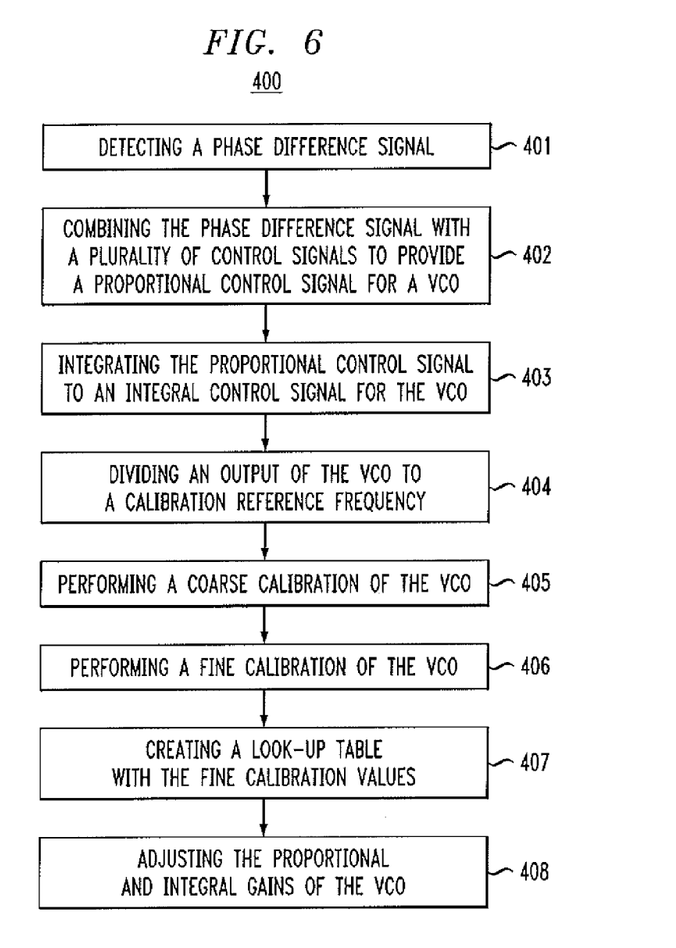
FIG. 6 shows a flowchart of an exemplary method for adjustments of a CDR loop gain based on the VOC calibration in the VCO based CDR shown in FIG. 5 according to an embodiment of the invention.

FIG. 6 shows a flowchart of an exemplary method for adjustments of a CDR loop gain based on the VCO calibration in the VCO based CDR shown in FIG. 5 according to an embodiment of the invention.

In the embodiment 400, phase detector 301 might detect a phase difference signal of a received input signal and a received feedback signal at step 401. At step 402, the phase difference signal might be combined in control multiplier 304 with gear shifting control signals produced by gear shifting control module 306 to provide a proportional control signal for VCO 302. At step 403, the proportional control signal might be integrated to an integral control signal for VCO 302. At step 404, an output frequency of VCO 302 might be divided to a calibration reference frequency by [[a]] programmable divider 310. Programmable divider 310 might be configured to divide the frequency of the output signal generated from VCO 302 with a given dividing ratio, convert the divided signals into multiple phase signals having multiple phases and output multiple phase signals. One of the divided signals of the output frequency of VCO 302 might be sent back to phase detector 301 as the feedback signal. Another one of the divided signals might be sent to frequency calibration module 303 as the calibration reference frequency, which might be compared to the reference clock frequency form a reference clock over a period of time. At step 405, frequency calibration module 303 might perform a coarse calibration of VCO 302 with the calibration reference frequency and a reference clock frequency from a reference clock. The coarse calibration might be done by changing supply voltage to the delay loop of VCO 302 until the output frequency $F_{VCO}$ is within a coarse calibration tolerance to the calibration reference frequency. At step 406, a fine calibration of VCO 302 might be performed by frequency calibration module 303 which might adjust the fine calibration control until $F_{VCO}$ is within a fine calibration tolerance to the calibration reference frequency. The fine calibration control might be applied in lieu of the integral control of VCO 302. The fine calibration values might then be loaded into limiting integrator 305 and serve as a starting value for the CDR loop when locking to serial input data. At step 407, LUT 308 might be created by the fine calibration values of VCO 302 generated by frequency calibration module 303. LUT 308 might be stored in calculation circuit 309 for calculating IGLIMIT and PGLIMIT gains of gear shifting control module 306 based on a region of a VCO control curve where the calibration might settle, as shown in FIG. 4. At step 408, the calculation of calibration circuit 309 might adjust gear shifted down to IGLIMIT and PGLIMIT for gear shifting control module 306, thus, adjust the gains of the gear shifting control signals generated by gear shifting control module 306. Since gear shifting control module 306 might control the proportional control loop gain and the integral control loop gain of VCO 302, the adjustment of the gains of the gear shifting control signals generated by gear shifting control module 306 might adjust the proportional and integral control loop gains of VCO 302. When the gear shifting is down, the adjustment of the proportional and the integral control loop gains might reach the final adjustment. The final adjustment of the proportional and integral control loop gains, where the gear shifting is down, might allow VCO 302 to compensate for VCO gain variability making an overall CDR loop gain adjustable over a VCO control curve and independent from the PVT variations.

Alternatively, IGSTART and PGSTART of gear shifting control module 306 might be adjusted along with IGLIMIT and PGLIMIT allowing the CDR loop to lock to data at the initial gains of IGSTART and PGSTART independent from the PVT variations.

Alternatively, an output of limiting integrator 305 might be provided to LUT 308, shown in FIG. 5 as a dashed line, controlling the CDR loop gain dynamically when the integral control moves along the VCO control curve shown in FIG. 4.

Figure 7:
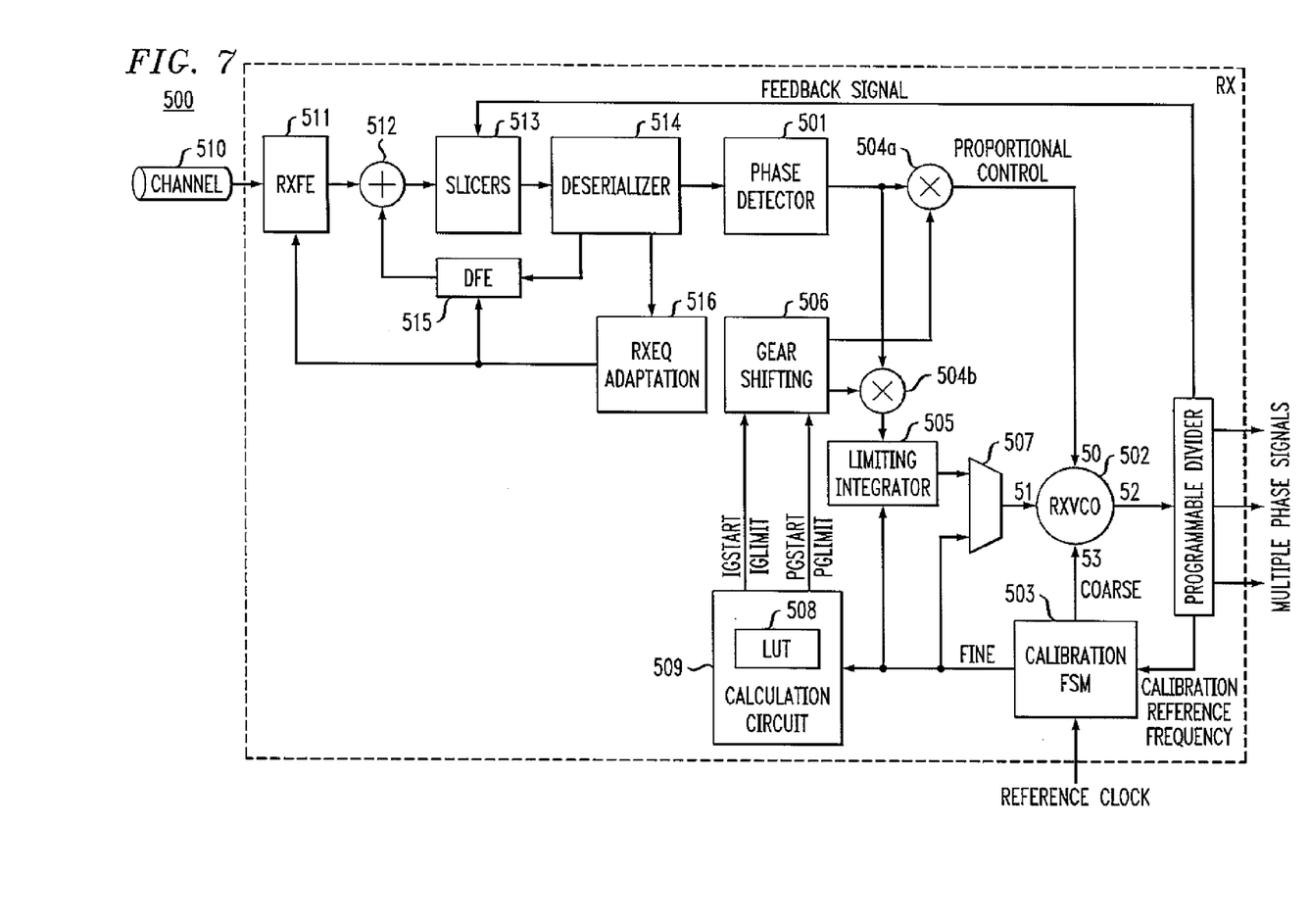
FIG. 7 shows an exemplary implementation of the VCO based CDR shown in FIG. 5 in implemented in a receiver in a SerDes device according to an embodiment of the invention.

FIG. 7 shows an implementation of the VCO based CDR shown in FIG. 5 implemented in a receiver (RX) of a SerDes device in accordance with an embodiment of the invention.

As shown, embodiment 500 includes phase detector 501, RXVCO 502, frequency calibration module 503, control multipliers 504a and 504b, limiting integrator 505, gear shifting control module 506, multiplexer 507, look-up table (LUT) 508, calculation circuit 509, channel 510, receiver front end (RXFE) 511, adder or summing node 512, slicers 513, deserializer 514, decision feedback equalization (DFE) 515, and receiver equalization (RXEQ) adaption 516. Generally, phase detector 501, RXVCO 502, frequency calibration module 503, limiting integrator 505, gear shifting control module 506, multiplexer 507, look-up table (LUT) 508, and calculation circuit 509 are identical in constitution and operation to phase detector 301, VCO 302, frequency calibration module 303, limiting integrator 305, gear shifting control module 306, and multiplexer 307 illustrated in FIG. 5. Control multipliers 504a, 504b are identical in constitution and operation to control multipliers 304a and 304b illustrated in FIG. 5.

Serial data might be input into embodiment 500 through channel 510. RXFE 511 and DFE 515 might enhance the data through amplifying and linear equalizing for embodiment 500. Slicers 513 might sample the serial data in order to obtain sampling data, sampling phase and other information used for a data and clock recovery, as well as for receiver equalization (RXEQ) adaption 516. The data and phase information from slicers 513 might be used in phase detector 501 which might detect in the known way if the sampling phase is leading or trailing the desired "center of the eye" sampling phase. The detected phase offset by phase detector 501 might be applied as the frequency control to the proportional control of RXVCO 502.

RXFE 511, adder 512, slicers 513, deserializer 514, DFE 515, and RXEQ adaption 516 might be selected from any existing and prospective RXFEs, multipliers, slicers, deserializers, DFEs and RXEQ adaption circuits known in the art. The technology of RXFE 511, adder 512, slicers 513, deserializer 514, DFE 515, and RXEQ adaption 516 might also be known in the art.

Referring herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

As used in this application, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion.

Additionally, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean, "one or more" unless specified otherwise or clear from context to be directed to a singular form.

Although the subject matter described herein may be described in the context of illustrative implementations to process one or more computing application features/operations for a computing application having user-interactive components the subject matter is not limited to these particular embodiments. Rather, the techniques described herein can be applied to any suitable type of user-interactive component execution management methods, systems, platforms, and/or apparatus.

Embodiments of the present invention may be implemented as circuit-based processes, including possible implementation as a single integrated circuit (such as an ASIC or an FPGA), a multi-chip module, a single card, or a multi-card circuit pack. As would be apparent to one skilled in the art, various functions of circuit elements may also be implemented as processing blocks in a software program. Such software may be employed in, for example, a digital signal, processor, micro-controller, or general-purpose computer. Further, while the exemplary embodiments of the present invention have been described with respect to processes of circuits, including possible implementation as a single integrated circuit, a multi-chip module, a single card, or a multi-card circuit, pack, embodiments of the present invention are not so limited. As would be apparent to one skilled in the art, various functions of circuit elements may also be implemented as processing blocks in a software program. Such software may be employed in, for example, a digital signal processor, micro-controller, or general purpose computer.

Embodiments of the present invention can be manifest in the form of methods and apparatuses for practicing those methods. Embodiments of the present invention can also be manifest in the form of program code embodied in tangible media, such as magnetic recording media, optical recording media, solid state memory, floppy diskettes, CD-ROMs, hard drives, or any other machine-readable storage medium, wherein, when the program code is loaded into and executed by a machine, such as a computer, the machine becomes an apparatus for practicing one or more embodiments of the invention. Embodiments of the present invention can also be manifest in the form of program code, for example, whether stored in a storage medium, loaded into and/or executed by a machine, or transmitted over some transmission channel, medium or carrier, such as over electrical wiring or cabling, through fiber optics, or via electromagnetic radiation, wherein, when the program code is loaded into and executed by a machine, such as a computer, the machine becomes an apparatus for practicing one or more embodiments of the invention. When implemented on a general-purpose processor, the program code segments combine with the processor to provide a unique device that operates analogously to specific logic circuits. Embodiments of the present invention can also be manifest in the form of a bitstream or other sequence of signal values electrically or optically transmitted through a medium, stored magnetic-field variations in a magnetic recording medium, etc., generated using a method and/or an apparatus embodiment of the present invention.

The use of figure numbers and/or figure reference labels in the claims is intended to identify one or more possible embodiments of the invention in order to facilitate the interpretation of the claims. Such use is not to be construed as necessarily limiting the scope of those claims to the embodiments shown in the corresponding figures.

It should be understood that the steps of the exemplary methods set forth herein are not necessarily required to be performed in the order described, and the order of the steps of such methods should be understood to be merely exemplary. Likewise, additional steps may be included in such methods, and certain steps may be omitted or combined, in methods consistent with various embodiments of the invention.

Although the elements in the following method claims, if any, are recited in a particular sequence with corresponding labeling, unless the claim recitations otherwise imply a particular sequence for implementing some or all of those elements, those elements are not necessarily intended to foe limited to being implemented in that particular sequence.

Also for purposes of this description, the terms "couple," "coupling," "coupled," "connect," "connecting," or "connected" refer to any manner known in the art or later developed in which energy is allowed to be transferred between two or more elements, and the interposition of one or more additional elements is contemplated, although not required. Conversely, the terms "directly coupled," "directly connected," etc., imply the absence of such additional elements.

No claim element herein is to be construed under the provisions of 35 U.S.C. §112, sixth paragraph, unless the element is expressly recited using the phrase "means for" or "step for."

It will be further understood that various changes in the details, materials, and arrangements of the parts which have been described and illustrated in order to disclose the various embodiments of the invention may be made by those skilled in the art without departing from the scope of embodiments of the invention as expressed in the following claims.

We claim:

1. Apparatus for a voltage-controlled oscillator based clock and data recovery circuit, the apparatus comprising:
    a phase detector for comparing the phase of feedback signal and an input signal and providing a phase difference signal between the input signal and the feedback signal;
    a voltage controlled oscillator responsive to a first control signal and a second control signal received at a respective first control input node and a respective second control input node and generating an output signal, wherein the output signal is divided to multiple phase signals by a programmable divider, and one of the multiple phase signals is coupled to the phase detector as the feedback signal;
    a frequency calibration module configured to calibrate the frequency of the output signal by performing a coarse calibration and a subsequent fine calibration, wherein another one of the multiple phase signals is sent to the frequency calibration module as a calibrating reference frequency that is compared to a reference clock frequency from a reference clock over a period of time;
    a gear shifting control module configured to generate gear shifting control signals according to a programmed variable gain, the gear shifting control module controlling a gain change of the first and second control signals in time, wherein the gear shifting control signals are combined with the phase difference signal in control multipliers to provide the first and second control signals for the voltage-controlled oscillator, and wherein the second control signal is provided by integrating the first control signal; and
    a look-up table created by fine calibration values generated from the frequency calibration module,
    wherein the programmed variable gain of the gear shifting control module is calculated by a calculation circuit employing the fine calibration values stored in the look-up table, the calculation of the calculation circuit adjusts gear shifting up or down, and adjusts a voltage-controlled oscillator gain, and adjusting an overall clock and data recovery gain over a voltage-controlled oscillator control curve.

2. The apparatus of claim 1, wherein the frequency calibration module includes a finite state machine.

3. The apparatus of claim 1, wherein the coarse calibration changes voltage to a delay loop of the voltage-controlled oscillator until the output signal of the voltage-controlled oscillator is within a coarse calibration tolerance.

4. The apparatus of claim 1, wherein the fine calibration values are applied through a multiplexer to the VCO in lieu of the second control signal, and the fine calibration is adjusted by the frequency calibration module until the output signal of the voltage-controlled oscillator is within a fine calibration tolerance.

5. The apparatus of claim 1, wherein the voltage-controlled oscillator control curve is nonlinear after calibration, and the calculation performed by the calculation circuit employing the look-up table adjusts gear shifting up or down based on a region of the voltage-controlled oscillator control curve where the fine calibration settles.

6. The apparatus of the claim 1, wherein the look-up table represents a plurality of gear shifting gains corresponding to different calibrated frequencies for the output signal of the voltage-controlled oscillator.

7. The apparatus of claim 1, wherein the voltage-controlled oscillator is a ring oscillator type voltage-controlled oscillator, an inductor-capacitor type voltage-controlled oscillator, or a multi vibrator.

8. The apparatus of claim 1, wherein the integrator is a limiting integrator.

9. The apparatus of claim 1, wherein the apparatus is embodied in a Serial DeSerializer device.

10. A method of adjustment of a voltage-controlled oscillator voltage-controlled oscillator based clock and data recovery circuit, the method comprising the steps of:
    detecting a phase difference signal between an input signal and a feedback signal by a phase detector;
    combining the phase difference signal with gear shifting control signals produced by a gear shifting control module to provide a first control signal for a voltage-controlled oscillator;
    integrating the phase difference signal to a second control signal by an integrator for the voltage-controlled oscillator;
    dividing an output of the voltage-controlled oscillator to multiple phase signals, wherein one of the multiple phase signals is coupled to a frequency calibration module as a calibrated reference frequency, another one of the multiple phase signals is sent back to the phase detector as the feedback signal, wherein the calibrating reference frequency is compared to a reference clock frequency from a reference clock to the frequency calibration module over a period of time;
    preforming a coarse calibration to the calibrated reference frequency of the voltage-controlled oscillator with the frequency calibration module;
    performing a fine calibration to the calibrated reference frequency of the voltage-controlled oscillator with the frequency calibration module;
    creating a look-up table with fine calibration values generated by the frequency calibration module;
    adjusting the gain of the circuit by adjusting gear shifting up or down by calculating gear shifting gains of the gear shifting control signals employing the fine calibration values stored in the look-up table.

11. The method of claim 10, wherein the frequency calibration module includes a finite state machine.

12. The method of claim 10, wherein the coarse calibration changes voltage to a delay loop of the voltage-controlled oscillator until the output signal of the voltage-controlled oscillator is within a coarse calibration tolerance.

13. The method of claim 10, wherein the fine calibration is adjusted by the frequency calibration module until the output signal of the voltage-controlled oscillator is within a fine calibration tolerance, and the fine calibration values are applied through a multiplexer to the voltage-controlled oscillator in lieu of the second control signal.

14. The method of claim 10, wherein the voltage-controlled oscillator control curve is nonlinear after calibration, and the calculation performed by the calculation circuit by the employing the look-up table adjusts gear shifting up or down based on a region of the voltage-controlled oscillator control curve where the fine calibration settles.

15. The method of claim 10, wherein the look-up table represents a plurality of gear shifting gains corresponding to different calibrated frequencies for the output signal of the voltage-controlled oscillator.

16. The method of claim 10, wherein the method is embodied as steps in a digital clock and data recovery routine.

17. The method of claim 10, wherein the integrator is a limiting integrator.

18. A non-transitory machine-readable storage medium, having encoded thereon program code, wherein, when the program code is executed by a machine, the machine implements a method for adjustment of a voltage-controlled oscillator based clock and data recovery circuit, comprising the steps of:

detecting a phase difference signal between an input signal and a feedback signal by a phase detector;

combining the phase difference signal with gear shifting control signal produced by a gear shifting control module to provide a first control signal for a voltage-controlled oscillator;

integrating the phase difference signal with gear shifting control signal produced by a gear shifting control module to a second control signal by an integrator for the voltage-controlled oscillator;

dividing an output of the voltage-controlled oscillator to multiple phase signals, wherein one of the multiple phase signals is coupled to a frequency calibration module as a calibrated reference frequency, another one of the multiple phase signals is sent back to the phase detector as the feedback signal, wherein the calibrating reference frequency is compared to a reference clock frequency from a reference clock to the frequency calibration module over a period of time;

preforming a coarse calibration to the calibrated reference frequency of the voltage-controlled oscillator with the frequency calibration module;

performing a fine calibration to the calibrated reference frequency of the voltage-controlled oscillator with the frequency calibration module;

creating a look-up table with fine calibration values generated by the frequency calibration module;

adjusting the gain of the circuit by adjusting gear shifting up or down by calculating gear shifting gains of the gear shifting control signals employing the fine calibration values stored in the look-up table.

19. The non-transitory machine-readable storage medium of claim 18, wherein the steps are executed in a Serial DeSerializer device.

20. The non-transitory machine-readable storage medium of claim 18, wherein the steps are executed in a digital clock and data recovery routine.

* * * * *